(12) United States Patent
Ko et al.

(10) Patent No.: US 7,696,615 B2
(45) Date of Patent: Apr. 13, 2010

(54) SEMICONDUCTOR DEVICE HAVING PILLAR-SHAPED TERMINAL

(75) Inventors: Jun-Young Ko, Chungcheongnam-do (KR); Dae-Sang Chan, Chungcheongnam-do (KR); Wha-Su Sin, Chungcheongnam-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/776,497

(22) Filed: Jul. 11, 2007

(65) Prior Publication Data

US 2008/0012116 A1    Jan. 17, 2008

(30) Foreign Application Priority Data

Jul. 13, 2006   (KR) .............. 10-2006-0065988

(51) Int. Cl.
*H01L 23/02* (2006.01)
*H01L 23/34* (2006.01)
*H01L 23/48* (2006.01)
*H01L 23/52* (2006.01)
*H01L 29/40* (2006.01)
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .............. 257/685; 257/341; 257/401; 257/686; 257/723; 257/777; 257/E25.029; 257/E25.03

(58) Field of Classification Search ........... 257/341, 257/401, 685–686, 723, 777, E25.029, E25.03
See application file for complete search history.

(56) References Cited

U.S. PATENT DOCUMENTS 5,084,753 A * 1/1992 Goida et al. .......... 257/685
5,637,536 A * 6/1997 Val .................... 438/686
5,777,381 A * 7/1998 Nishida ............... 257/693

(Continued)

FOREIGN PATENT DOCUMENTS

JP       2003-174120       6/2003

(Continued)

OTHER PUBLICATIONS

English language abstract of Japanese Publication No. 2003-174120.

(Continued)

*Primary Examiner*—Ida M Soward
(74) *Attorney, Agent, or Firm*—Myers Bigel Sibley & Sajovec, P.A.

(57) ABSTRACT

A semiconductor device and a method of forming the same are provided. A semiconductor chip included in the semiconductor device includes a pillar-shaped terminal and a pad-shaped terminal in a terminal region. The pillar-shaped terminal is exposed at a first surface of a chip substrate in the terminal region and the pad-shaped terminal is exposed at a second surface of the chip substrate in the terminal region, where the first surface and the second surface of the chip substrate in the terminal region face oppositely from each other.

15 Claims, 7 Drawing Sheets

U.S. PATENT DOCUMENTS

| | | | |
|---|---|---|---|
| 6,498,053 B2 * | 12/2002 | Mastromatteo et al. | 438/107 |
| 6,521,530 B2 * | 2/2003 | Peters et al. | 438/667 |
| 6,677,668 B1 * | 1/2004 | Lin | 257/685 |
| 6,709,894 B2 * | 3/2004 | Tsai et al. | 438/113 |
| 6,972,243 B2 | 12/2005 | Patel | 438/461 |
| 7,049,682 B1 * | 5/2006 | Mathews et al. | 257/660 |
| 7,230,329 B2 * | 6/2007 | Sawamoto et al. | 257/686 |
| 2003/0062631 A1 | 4/2003 | Nemoto | 257/787 |
| 2004/0195669 A1 * | 10/2004 | Wilkins et al. | 257/698 |
| 2007/0045875 A1 * | 3/2007 | Farnworth et al. | 257/787 |
| 2007/0181992 A1 * | 8/2007 | Lake | 257/698 |

FOREIGN PATENT DOCUMENTS

| | | |
|---|---|---|
| KR | 2003-0080187 | 10/2003 |
| KR | 10-2006-0010099 | 2/2006 |
| KR | 10-2006-0050151 | 5/2006 |
| KR | 10-2006-0069525 | 6/2006 |

OTHER PUBLICATIONS

English language abstract of Korean Publication No. 2003-0080187.
English language abstract of Korean Publication No. 10-2006-0010099.

* cited by examiner

SEMICONDUCTOR DEVICE HAVING PILLAR-SHAPED TERMINAL

CROSS-REFERENCE TO RELATED APPLICATIONS

This U.S. non-provisional patent application claims priority under 35 U.S.C. §119 to Korean Patent Application 2006-65988 filed on Jul. 13, 2006, the entirety of which is hereby incorporated by reference.

BACKGROUND

The present invention relates to semiconductor devices and methods of forming the same. More specifically, the present invention is directed to a semiconductor device with a semiconductor chip and a method of forming the same.

A semiconductor fabricating process may be categorized into two processes: a front-end process and a back-end process. In the front-end process, semiconductor chips are formed on a wafer by means of photolithography, etching, and/or deposition. In the back-end process, the semiconductor chips are packaged.

A conventional semiconductor package generally includes only one semiconductor chip. However, multi-functional semiconductor packages and highly integrated semiconductor packages have been required with the remarkable advance in electronic technologies. In recent years, stacked packages have been suggested for multi-functionality and high integration. The stacked package includes a plurality of semiconductor chips. Conventionally, terminals of such stacked semiconductor chips are coupled to each other or coupled to an external terminal by means of wire bonding technology. Unfortunately, various problems are encountered when the wire bonding technology is employed to couple stacked semiconductor chips. For example, the basic length and structure of bonding wire itself can make it difficult to reduce the size of a package and generally results in signal delay caused by the electrical properties of the wire. Moreover, terminals of the stacked semiconductor chips generally need to be exposed for wire bonding. Thus, the sizes of the stacked semiconductor chips may be varied to accommodate the wire bonding coupling, which usually leads to increases in the size of the package. In addition, the wire bonding may complicate fabrication because of the difficulty in stacking the semiconductor chips while accommodating the space necessary for the wire bonding.

SUMMARY

Exemplary embodiments of the present invention are directed to a semiconductor device and a method of forming the semiconductor device. In one exemplary embodiment, the semiconductor device includes a semiconductor chip including a first chip substrate having opposite facing first and second surfaces and a second chip substrate having opposite facing first and second surfaces, where a side of the second chip substrate is in contact with a side of the first chip substrate. The first chip substrate may include a semiconductor material while the second chip substrate may include an insulating material. The semiconductor chip also includes a pillar-shaped terminal disposed to penetrate the second chip substrate and a pad-shaped terminal disposed on the first surface of the second chip substrate. The second surfaces of the first and second chip substrates are coplanarly disposed and the pillar-shaped terminal has a contact surface that is coplanar with the second surface of the second chip substrate.

DETAILED DESCRIPTION

Figure 1:
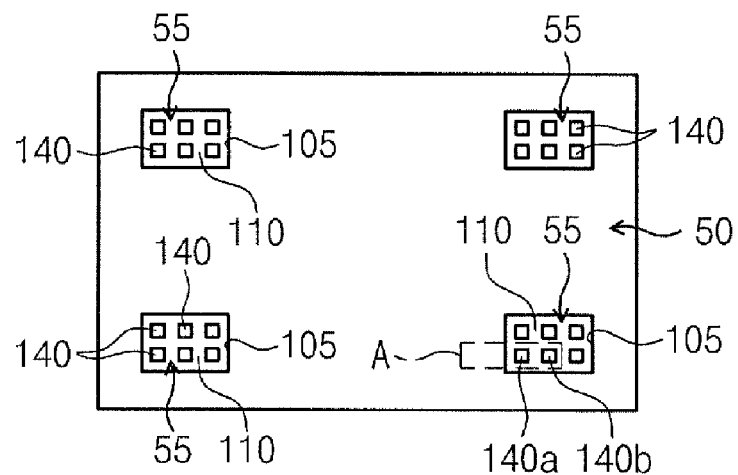
FIG. 1 is a plan view of a semiconductor chip according to an embodiment of the present invention.

The present invention will now be described more fully hereinafter with reference to the accompanying drawings, in which exemplary embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 2:
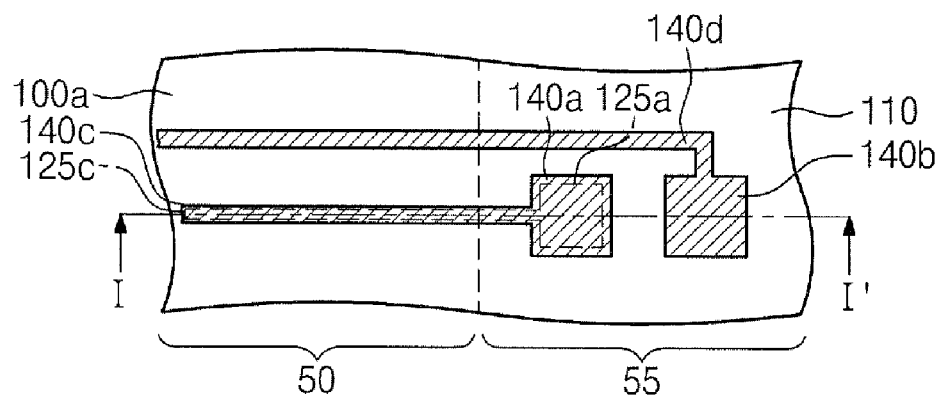
FIG. 2 is an enlarged plan view of an "A" portion illustrated in FIG. 1.
Figure 3:
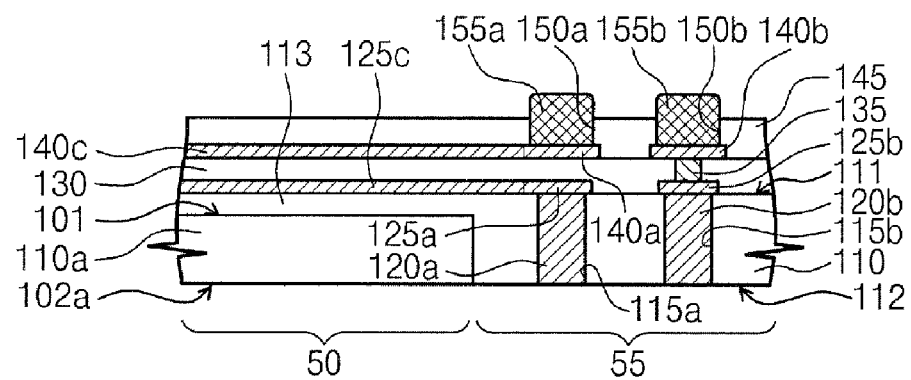
FIG. 3 is a cross-sectional view taken along line I-I' of FIG. 2.

FIG. 1 is a plan view of a semiconductor chip 200b according to an embodiment of the present invention, and FIG. 2 is an enlarged plan view of an "A" portion illustrated in FIG. 1. FIG. 3 is a cross-sectional view taken along line I-I' of FIG. 2.

Referring to FIGS. 1, 2, and 3, the semiconductor chip 200b includes an integration circuit (IC) region 50 and a terminal region 55. A chip substrate 100a of the IC region 50 is defined as a first chip substrate 100a, and a chip substrate 110 of the terminal region 55 is defined as a second chip substrate 110. The first chip substrate 100a is formed of a semiconductor and includes a first surface 101 and a second surface 102a that are opposite to each other. An IC is formed on the first surface 101 of the first chip substrate 110a. In particular, singular components (e.g., MOS transistors, capacitors, resistors, etc.) constituting the IC are formed on the first surface 101 of the first chip substrate 110a.

The second chip substrate 110 includes a side that is in contact with the side of the first chip substrate 100a. Similar to the first chip substrate 100a, the second chip substrate 110 includes a first surface 111 and a second surface 112 that are opposite to each other. The first surfaces 101 and 111 of the first and second chip substrates 100a and 110 are positioned coplanarly. The second chip substrate 110 is formed of an insulating material. The second chip substrate 110 may be formed of a single insulating layer or a plurality of insulating layers. In the case where the second chip substrate 110 is formed of a plurality of insulating layers, the types of insulating layers may be identical to each other or different from each other. The thickness of the second chip substrate 110 may be larger than that of the first chip substrate 100a. That is, a distance between the first and second surfaces 111 and 112 of the second chip substrate 110 may be larger than that between the first and second surfaces 101 and 102a of the first chip substrate 100a. The first chip substrate 100a may have a thickness ranging from about 1 to about 200 micrometers.

An insulation layer 113 is disposed to cover the first surface 101 of the first chip substrate 100a. The insulation layer 113 may be in contact with the second chip substrate 110. The insulation layer 113 includes a first surface and a second surface that are opposite to each other. The second surface of the insulation layer 113 is disposed adjacent to the first surface 101 of the first chip substrate 100a. The first surface of the insulation layer 113 may be coplanar with the first surface 111 of the second chip substrate 110. The second chip substrate 110 may include substantially the same material as the insulation layer 113.

First and second pillar-shaped terminals 120a and 120b are formed to penetrate the second chip substrate 110. The first and second pillar-shaped terminals 120a and 120b are laterally spaced apart from each other. The first and second pillar-shaped terminals 120a and 120b are formed to fill first and second pillar holes 115a and 115b formed to penetrate the second chip substrate 110, respectively. The first and second pillar-shaped terminals 120a and 120b include first and second contact surfaces positioned to be coplanar with the second surface 112 of the second chip substrate 110, respectively. That is, the first and second contact surfaces of the first and second pillar-shaped terminals 120a and 120b are exposed. The first pillar-shaped terminal 120a includes a first inner surface that is opposite to the first contact surface, and the second pillar-shaped terminal 120b includes a second inner surface that is opposite to the second contact surface. Each of the pillar-shaped terminals 120a and 120b is formed of a conductive material. In some embodiments, each of the pillar-shaped terminals 120a and 120b may be made of a metal such as tungsten (W), aluminum (Al), or copper (Cu).

A first wiring 125c is disposed on the first surface of the insulation layer 113. That is, the insulation layer 113 is interposed between the first wiring 125c and the first surface 101 of the first chip substrate 100a. The first wiring 125c extends laterally to the first surface 111 of the second chip substrate 110 to be electrically connected to the first pillar-shaped terminal 120a. A first buffer pattern 125a may be disposed on the first inner surface of the first pillar-shaped terminal 120a. The first wiring 125c may be in direct contact with the first buffer pattern 125a and in contact with the first inner surface of the first pillar-shaped terminal 120a. A second buffer pattern 125b may be disposed on the first inner surface of the second pillar-shaped terminal 120b. The first and second buffer patterns 125a and 125b as well as the first wiring 125c may be formed of substantially the same conductive material such as, for example, tungsten (W), aluminum (Al), or copper (Cu). The first wiring 125c may be electrically connected to the singular components constituting the IC through a first contact plug (not shown) formed to penetrate the insulation layer 113. A plurality of the first wirings 125c may be connected to the first pillar-shaped terminal 120a.

An interlayer dielectric 130 is disposed to cover the first surfaces 101 and 111 of the first and second chip substrates 100a and 110, the first wiring 125c, the first buffer pattern 125a, and the second buffer pattern 125b. The interlayer dielectric 130 includes first and second surfaces that are opposite to each other. The second surface of the interlayer dielectric 130 is positioned adjacent to the first surfaces 101 and 111 of the chip substrates 100a and 110.

First and second pad-shaped terminals 140a and 140b are disposed on the first surface of the interlayer dielectric 130 within the terminal region 55. That is, the interlayer dielectric 130 is interposed between the first pad-shaped terminals 140a and the first side 111 of the second chip substrate 110 and between the second pad-shaped terminals 140b and the first side 111 of the second chip substrate 110. The first and second pad-shaped terminals 140a and 140b are laterally spaced apart from each other. Second and third wirings 140c and 140d are disposed on the first surface of the interlayer dielectric 130 (i.e., on the first surface 101 of the first chip substrate 100a) within the IC region 50 to be spaced apart from each other. The second wiring 140c extends to the terminal region 55 to be electrically connected to the first pad-shaped terminal 140a. The third wiring 140d extends to the terminal region 55 to be electrically connected to the second pad-shaped terminal 140b. The second and third wirings 140c and 140d are in direct contact with the first and second pad-shaped terminals 140a and 140b, respectively. The first and second pad-shaped terminals 140a and 140b as well as the second and third wirings 140c and 140d may be formed of substantially the same material such as, for example, tungsten (W), aluminum (Al), or copper (Cu). A conductive plug 135 is disposed to penetrate the interlayer dielectric 130 within the terminal region 55. The conductive plug 135 is provided to electrically connect the second pad-shaped terminal 140b and the second pillar-shaped terminal 120b to each other. The conductive plug 135 is connected to the second buffer pattern 125b. The second pad-shaped terminal 140b, the conductive plug 140b, and the second pillar-shaped terminal 120b may be aligned substantially perpendicularly. In this case, the first pillar-shaped terminal 120a and the first pad-shaped terminal 140a may be insulated from each other by the interlayer dielectric 130.

The second and third wirings 140c and 140d may be electrically connected to the singular components constituting the IC and/or conductive patterns (not shown) formed with the same level as the first wiring 125c through the interlayer dielectric 130 within the IC region 50. A plurality of the second wirings 140c may be connected to the first pad-shaped terminal 140a. Similarly, a plurality of the third wirings 140d may be connected to the second pad-shaped terminal 140b.

A passivation layer 145 is disposed to cover the first surfaces 101 and 111 of the chip substrates 100a and 110, the first and second pad-shaped terminals 140a and 140b, and the second and third wirings 140c and 140d. The passivation layer 145 is formed of an insulating material to protect the semiconductor chip 200b. For example, the passivation layer may include at least one selected from the group consisting of a nitride, an oxynitride, and a polymer.

First and second bumps 155a and 155b are disposed to fill first and second apertures 150a and 150b formed to penetrate the passivation layer 145. The first aperture 150a is formed to expose the first pad-shaped terminal 140a through the passivation layer 145, and the second aperture 150b is formed to expose the second pad-shaped terminal 140b through the passivation layer 145. Thus, the first and second bumps 155a and 155b are electrically connected to the first and second pad-shaped terminals 140a and 140b, respectively. Each of the bumps 155a and 155b has a larger thickness than that of the passivation layer 145. Accordingly, the bumps 155a and 155b protrude above the passivation layer 145. Each of the bumps 155a and 155b is formed of a conductive material.

The semiconductor chip 200b includes at least one selected from the group consisting of first-type input/output terminals (first-type I/O terminals) including the first pillar-shaped terminal 120a and the first pad-shaped terminal 140a and second-type input/output terminals (second-type I/O terminals) including the second pillar-shaped terminal 120b and the second pad-shaped terminal 140b. That is, semiconductor chip 200b may include only the first-type I/O terminals or only the second-type I/O terminals. Alternatively, the semiconductor chip 200b may include both the first-type I/O terminals and the second-type I/O terminals.

As illustrated in FIG. 1, the second chip substrate 110 may be disposed to fill the hole 105 formed to penetrate the first chip substrate 100a. A plurality of the holes 105 are formed at the first chip substrate 100a, and the semiconductor chip 200b may include a plurality of second chip substrate 110 disposed to fill the plurality of the holes 105 respectively. Other input/output terminals 140 formed within the terminal regions 110 may be the first-type I/O terminals or the second-type I/O terminals.

Now, the state of the semiconductor chip 200b having a wafer level will be described below.

Figure 4:
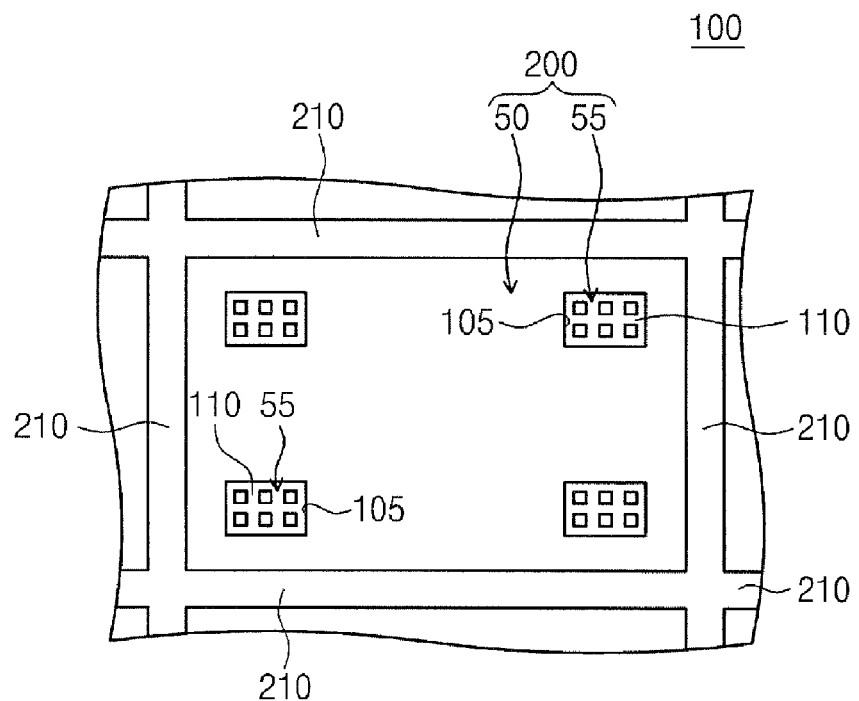
FIG. 4 is a plan view showing the state before the semiconductor chip illustrated in FIG. 1 is sawed from a wafer.

FIG. 4 is a plan view showing the state before the semiconductor chip illustrated in FIG. 1 is sawed from a wafer. The wafer, i.e., a semiconductor substrate 100 includes a chip area 200 and a scribe region 210. A plurality of chip areas 200 are two-dimensionally arranged on the semiconductor substrate 100 along rows and columns. The scribe region 210 is disposed between the chip areas 200. The chip area 200 includes an integrated circuit (IC) region 50 and a terminal region 55 surrounded by the IC region 50. That is, the terminal region 55 is disposed within a hole 105 formed at the IC region 50. The terminal region 55 is spaced apart from the scribe region 210.

Now, a semiconductor package (hereinafter referred to as "package") including the semiconductor chip 200b illustrated in FIGS. 1, 2, and 3 will be described below.

Figure 5:
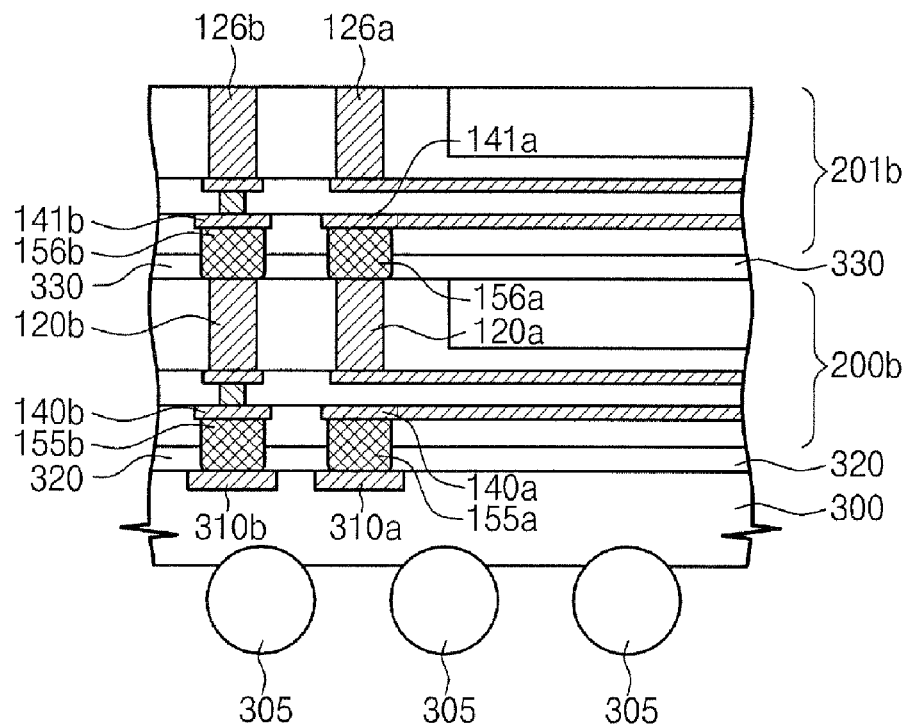
FIG. 5 is a cross-sectional view of a semiconductor device with the semiconductor chip according to another embodiment of the present invention.

FIG. 5 is a cross-sectional view of a semiconductor device with the semiconductor chip according to an embodiment of the present invention. A semiconductor chip 200b is installed on a package substrate 300 with first and second connection terminals 310a and 310b. First and second bumps 155a and 155b of the first semiconductor chip 200b are connected to the first and second connection terminals 310a and 310b, respectively. That is, a first pad-shaped terminal 140a of the first semiconductor chip 200b is electrically connected to the first connection terminal 310a and a second pad-shaped terminal 140b of the first semiconductor chip 200b is electrically connected to the second connection terminal 310b.

The package substrate 300 includes a first surface and a second surface that are opposite to each other. The connection terminals 310a and 310b are disposed at the first surface of the package substrate 300, and external terminals 305 are disposed at the second surface thereof. The external terminals 305 may be ball-shaped terminals. The package substrate 300 may include a printed circuit board (PCB). In addition, the package substrate 300 may include a PCB and another type of semiconductor chip that are stacked sequentially. The connection terminals 310a and 310b may be included in the PCB or the other type of semiconductor chip. The other type of semiconductor chip and the PCB may be connected to each other by means of wire bonding.

A first bonding layer 320 is interposed between the first semiconductor chip 200b and the package substrate 300. The first bonding layer 320 enables the first semiconductor chip 200b and the package substrate 300 to tightly bond to each other. The first bonding layer 320 may be made of an insulating material. The first and second bumps 155a and 155b are in electrical contact with the first and second connection terminals 310a and 310b through holes formed to penetrate the first bonding layer 320, respectively. Thus, the second surface of the first semiconductor chip 200b faces upwardly.

A second semiconductor chip 201b is stacked on the first semiconductor chip 200b. The second semiconductor chip 201b includes first and second input/output terminals (first and second I/O terminals). The first I/O terminal of the second semiconductor chip 201b is electrically connected to a contact surface of a first pillar-shaped terminal 120a of the first semiconductor chip 200b, and the second I/O terminal of the second semiconductor chip 201b is electrically connected to a contact surface of a second pillar-shaped terminal 120b of the first semiconductor chip 200b.

The first I/O terminal of the second semiconductor chip 201b may have substantially the same shape as the first-type I/O terminal of the first semiconductor chip 200b. Alternatively, the first I/O terminal of the second semiconductor chip 201b may have substantially the same shape as the second-type I/O terminal of the first semiconductor chip 200b. Similarly, the second I/O terminal of the second semiconductor chip 201b may have substantially the same shape as the first-type I/O terminal of the first semiconductor chip 200b. Alternatively, the second I/O terminal of the second semiconductor chip 201b may have substantially the same shape as the second-type I/O terminal of the first semiconductor chip 200b.

As shown in FIG. 5, the first and second I/O terminals of the second semiconductor chip 201b have substantially the same shapes as the first and second-type I/O terminals of the first semiconductor chip 200b, respectively. That is, the first I/O terminal of the second semiconductor chip 201b includes a first pad-shaped terminal 141a and a first pillar-shaped terminal 126a, which are insulted from each other. The second I/O terminal of the second semiconductor chip 201b includes a second pad-shaped terminal 141b and a second pillar-shaped terminal 126b, which are electrically connected to each other. The first and second pad-shaped terminals 141a and 141b of the second semiconductor chip 201b are electrically connected to contact surfaces of the first and second pillar-shaped terminals 120a and 120b of the first semiconductor chip 200b, respectively. A third bump 156a is interposed between the first pad-shaped terminal 141a of the second semiconductor chip 201b and the first pillar-shaped terminal 120a of the first semiconductor chip 200b, and a fourth bump 156b is interposed between the second pad-shaped terminal 141b of the second semiconductor chip 201b and the second pillar-shaped terminal 120b of the first semiconductor chip 200b.

A second bonding layer 330 is interposed between the first semiconductor chip 200b and the second semiconductor chip 201b. The second bonding layer 330 enables the first and second semiconductor chips 200b and 201b to be tightly bond to each other. The second bonding layer 330 is formed of an insulating material. The third and fourth bumps 156a and 156b are disposed to fill apertures formed to penetrate the second bonding layer 330, respectively.

Although not shown, another semiconductor chip may be stacked on the second semiconductor chip 201b. Input/output terminals (I/O terminals) of the other semiconductor chip may be electrically connected to the contact surfaces of the first and second pillar-shaped terminals 126a and 126b of the second semiconductor chip 201b, respectively.

The above-described semiconductor device includes a pillar-shaped terminal 120a or 120b disposed to penetrate a chip substrate 110 in a terminal region and a pad-shaped terminal 140a or 140b disposed on a first surface 111 of the chip substrate 110 in the terminal region. The pad-shaped terminal and the pillar-shaped terminal are electrically connected to underlying and overlying structures. Thus, wire bonding for installing the semiconductor chip 200b of the semiconductor device on another structure is not required. It may be therefore possible to reduce the fabrication cost of the semiconductor device, enhance the operating speed of the semiconductor device, and achieve higher integration density of the semiconductor device.

The terminal region 55 is surrounded by the IC region 55. Alternatively, a terminal region may be positioned in a semiconductor chip with another positioning type. This will now be described below with reference to FIG. 6.

Figure 6:
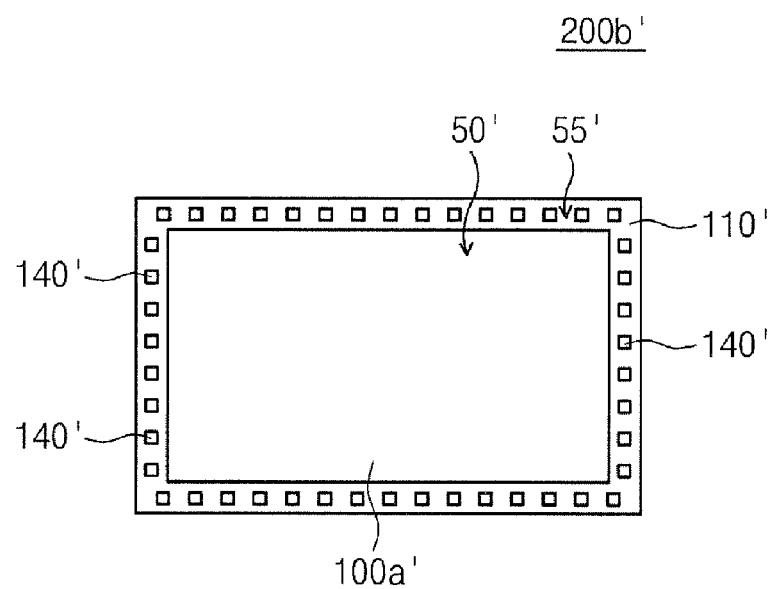
FIG. 6 is a plan view of a modified version of the semiconductor chip according to another embodiment of the present invention.

FIG. 6 is a plan view of a modified version of the semiconductor chip according to another embodiment of the present invention. A semiconductor chip 200b' includes an integrated circuit (IC) region 50' and a terminal region 55'. A first chip substrate 100a' of the IC region 50' is surrounded by a second chip substrate 110' of the terminal region 55'. That is, the side of the second chip substrate 110' is disposed to surround the entire side of the first chip substrate 100a'. The second chip substrate 110' takes the shape of a rim. The first chip substrate 100a' is formed of a semiconductor and the second chip substrate 110' is formed of an insulating material. A plurality of input/output terminals (I/O terminals) 140' are disposed in the terminal region 55'. The I/O terminals 140' may have substantially the same shape as the first-type I/O terminal (i.e., the I/O terminal including the first pillar-shaped terminal 125a and the first pad-shaped terminal 140a) or may have substantially the same shape as the second-type I/O terminal (i.e., the I/O terminal including a second pillar-shaped terminal 125b and a second pad-shaped terminal 140b) described with reference to FIGS. 1 through 3.

Figure 7:
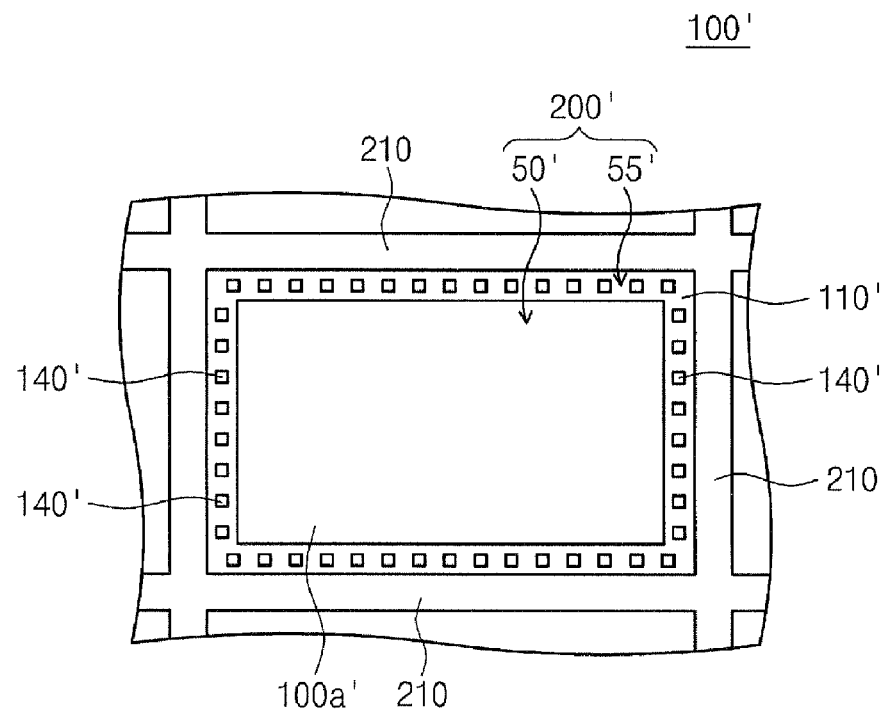
FIG. 7 is a plan view showing the state before the semiconductor chip illustrated in FIG. 6 is sawed from a wafer.

FIG. 7 is a plan view showing the state before the semiconductor chip 200b' illustrated in FIG. 6 is sawed from a wafer. The wafer, i.e., semiconductor substrate 100' includes a plurality of chip areas 200' and a scribe region 210 between the chip areas 200'. The chip area 200' includes an integrated circuit (IC) region 50' and a terminal region 55'. The terminal region 55' is disposed at the edge of the chip area 200', and the IC region 50' is disposed at the center of the chip area 200'. The terminal region 55' is disposed to surround the IC region 50'. As a result, the terminal region 55' is included in the chip area 200'. That is, the terminal region 55' is not included in the scribe region 210.

A method of forming a semiconductor according to the present invention will now be described with reference to FIGS. 8 through 13.

Figure 8:
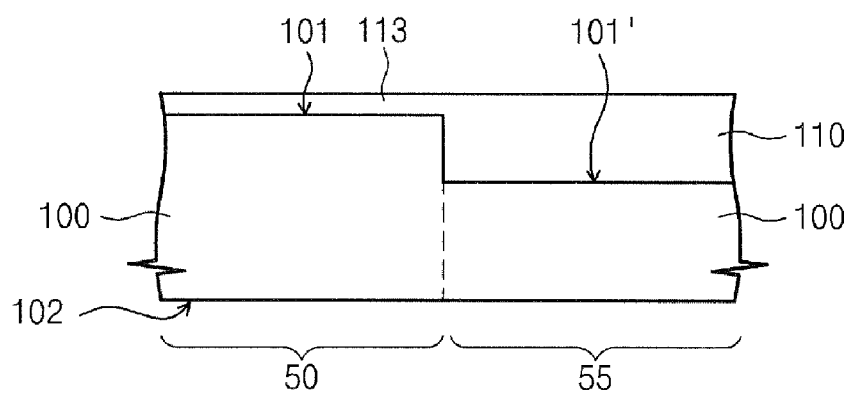
FIGS. 8 through 13 are cross-sectional views illustrating a method of forming a semiconductor device according to yet another embodiment of the present invention.

Referring to FIG. 8, a semiconductor substrate 100 is provided with a first surface 101 and a second surface 102 that are opposite to each other. The semiconductor substrate 100 includes a chip area and a scribe region disposed to surround the chip area. The chip area includes an integrated circuit (IC) region 50 and a terminal region 55.

The first surface 101 of the semiconductor substrate 100 in the terminal region 55 is lowered by means of an etching process to form a concave region. In the semiconductor substrate 100 including the concave region, a first surface 101' of the semiconductor substrate 100 in the terminal region 55 is lower than the first surface 101 of the semiconductor substrate 100 in the IC region 55. In the case where the terminal region 55 has same type as illustrated in FIG. 4, the concave region is formed to be a hole surrounded by the IC region 50.

On the other hand, in the case where the terminal region 55 has the same shape as illustrated in FIG. 7, the concave region is formed to be a groove disposed along the edge of the chip area. In other words, the concave region is formed to be a groove disposed so as to surround the IC region 50.

An insulation layer 110 is formed on the entire surface of the semiconductor substrate 100 to fill the concave region.

The reference numeral '113' denotes a portion of the insulation layer 110 formed on the semiconductor substrate 100 in the IC region 50. The insulation layer 110 includes at least one selected from the group consisting of an oxide, a nitride, and an oxynitride.

Prior to the formation of the insulation layer 110, singular components constituting an integrated circuit (IC) may be formed on the semiconductor substrate 100 (i.e., the first surface 101) in the IC region 50.

Figure 9:
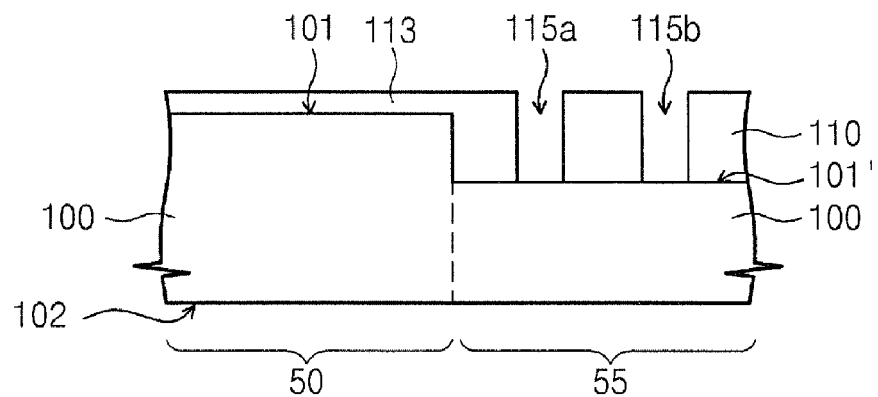

Referring to FIG. 9, by patterning the insulation layer 110 in the terminal region 55, first and second pillar holes 115a and 115b are formed to expose the first surface 101' of the semiconductor substrate 100. Although not illustrated in the figure, a first contact hole may be formed in the IC region to penetrate the insulation layer 113.

Figure 10:
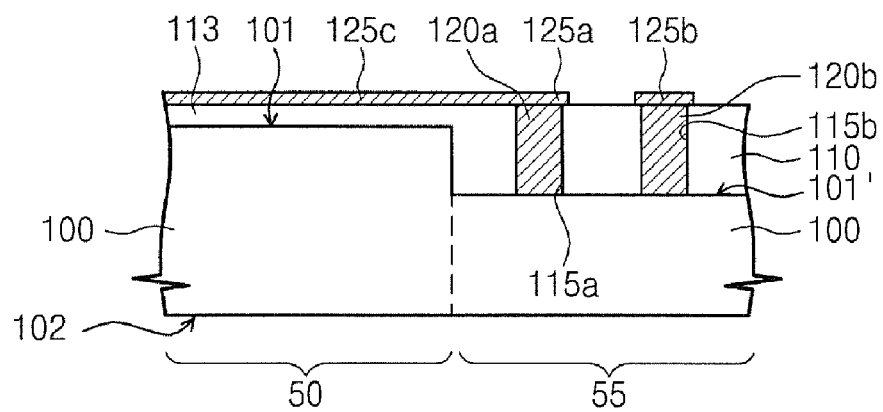

Referring to FIG. 10, first and second pillar-shaped terminals 120a and 120b are formed to fill the first and second pillar holes 115a and 115b, respectively. The first and second pillar-shaped terminals 120a and 120b may be formed of a conductive material such as, for example, tungsten (W), aluminum (Al), or copper (Cu).

A first conductive layer is formed on the insulation layer 113 and the insulation layer 110. The first conductive layer is patterned to form a first buffer pattern 125a, a second buffer pattern 125b, and a first wiring 125c. The first buffer pattern 125a is disposed on the first pillar-shaped terminal 120a, and the second buffer pattern 125b is disposed on the second pillar-shaped terminal 125b. The first wiring 125c is disposed on the insulation layer 113 and extends laterally to come in electric contact with the first buffer pattern 125a. The first conductive layer may include tungsten (W), aluminum (Al), or copper (Cu).

Figure 11:
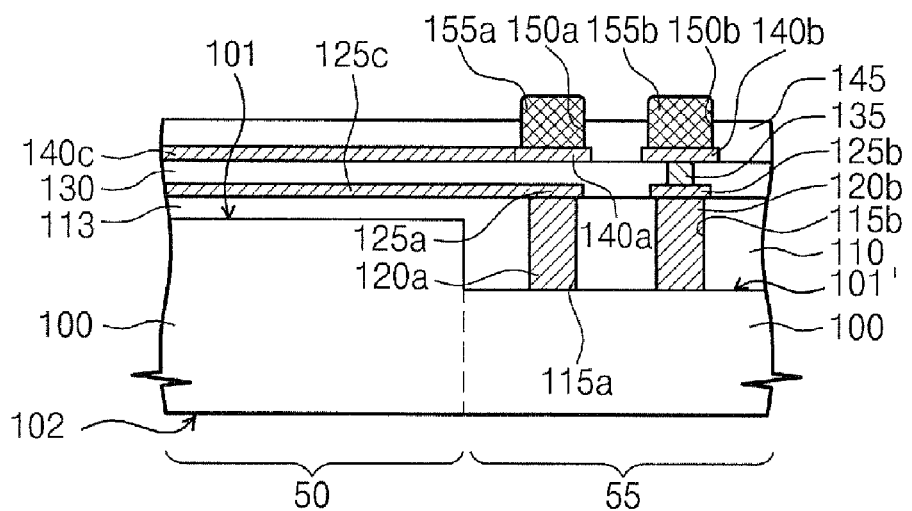

Referring to FIG. 11, an interlayer dielectric 130 is formed on the entire surface of the first surface of the semiconductor substrate 100 to cover the first buffer pattern 125a, the second buffer pattern 125b, and the first wiring 125c. A conductive plug 135 is formed to penetrate the interlayer dielectric 130 electrically connect with the second buffer pattern 125b. The conductive plug 135 may include tungsten (W), aluminum (Al), or copper (Cu).

A second conductive layer is formed on the entire surface of the semiconductor substrate 100. The second conductive layer is patterned to form a first pad-shaped terminal 140a, a second pad-shaped terminal 140b, a second wiring 140c, and a third wiring (140d of FIG. 2). The first and second pad-shaped terminals 140a and 140b are disposed within the terminal region 55. The second pad-shaped terminal 140b is connected to the conductive plug 135 to be electrically connected to the second pillar-shaped terminal 120b. The second wiring 140c is disposed within the IC region 50 and extends laterally to be connected to the first pad-shaped terminal 140a. The third wiring (140d of FIG. 2) is disposed within the IC region 50 and extends laterally to be connected to the second pad-shaped terminal 140b.

A passivation layer 145 is formed on the entire surface of the first surfaces 101 and 101' of the semiconductor substrate 100. By patterning the passivation layer 145, first and second apertures 150a and 150b are formed to expose the first and second pad-shaped terminals 140a and 140b, respectively.

A first bump 155a is formed to fill the first aperture 150a and electrically connect with the exposed first pad-shaped terminal 140a. A second bump 155b is formed to fill the second aperture 150b and electrically connect with the exposed second pad-shaped terminal 140b and fill the second aperture 150b. The formation of the first and second bumps 155a and 155b may be done by means of electroplating.

Figure 12:
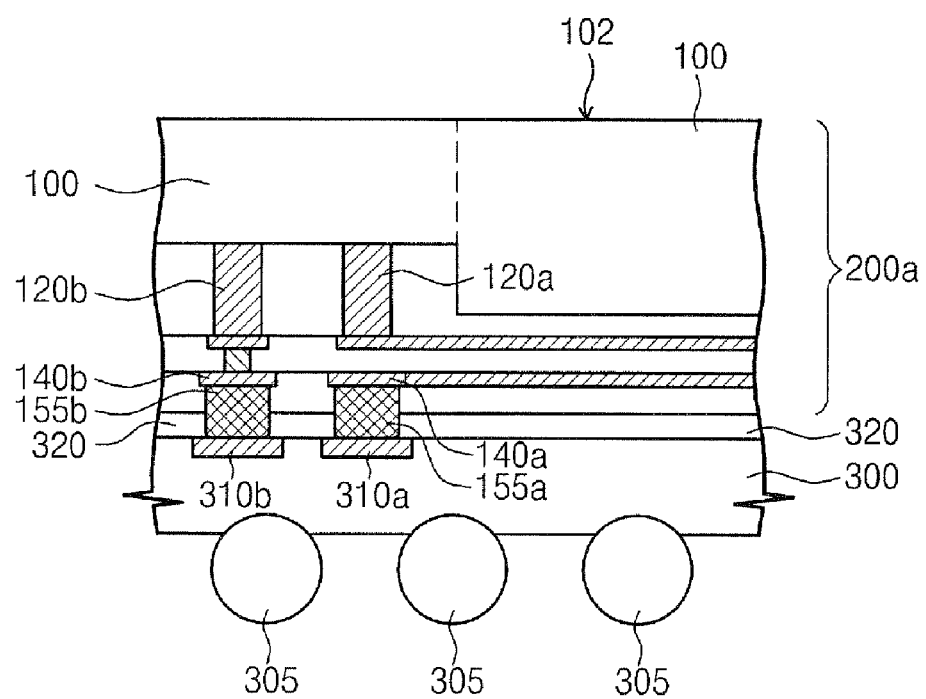

Referring to FIG. 12, before grinding the second surface 102 of the semiconductor substrate 100, the semiconductor substrate 100 is sawed along the scribe region to separate chip areas. Each of the separate chip areas is defined as a preliminary semiconductor chip 200a. The preliminary semiconductor chip 200a is installed on a package substrate 300. First and second bumps 155a and 155b of the preliminary semiconductor chip 200a are connected to first and second connection terminals 310a and 310b of the package substrate 300, respectively. Thus, the second surface 102 of the semiconductor substrate 100 is exposed to the outside. A bonding layer 320 may be further formed between the preliminary semiconductor chip 200a and the package substrate 300.

Figure 13:
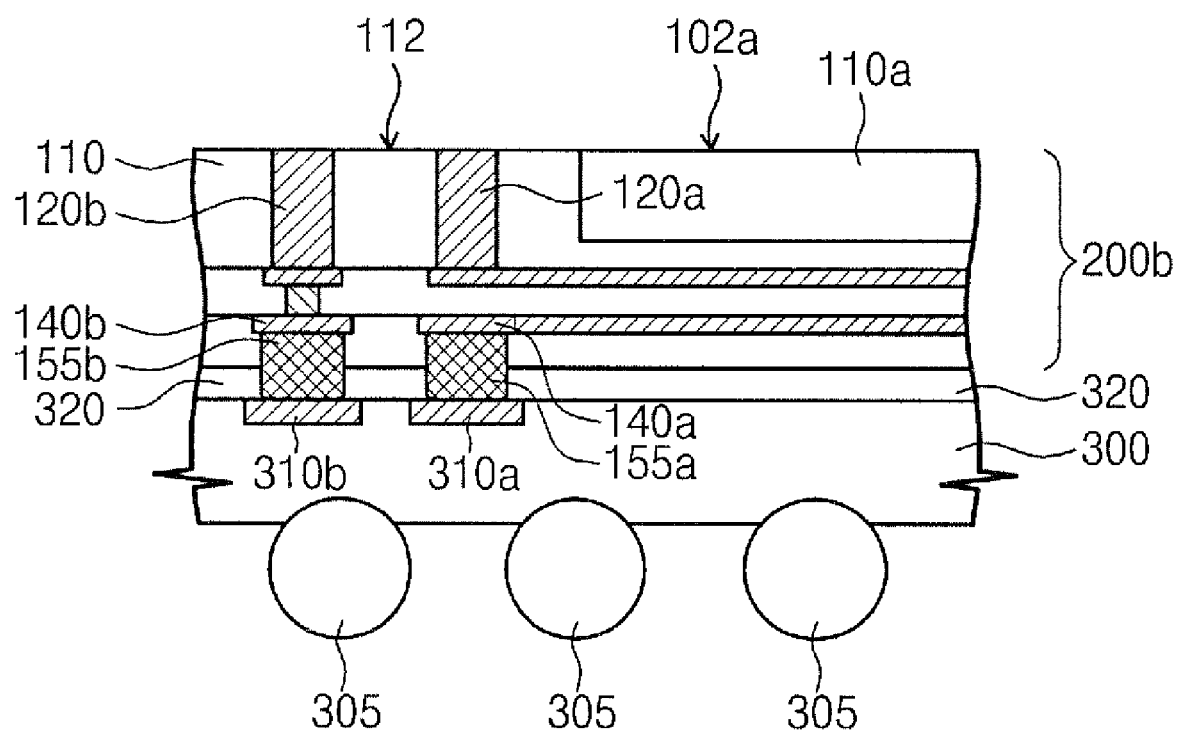

Referring to FIG. 13, a second surface 102 of the preliminary semiconductor chip 200a is ground until the pillar-shaped terminals 120a and 120b and the insulation layer 110 in the terminal region 55 are exposed. Thus, the semiconductor chip 200b illustrated in FIGS. 1 through 3 may be formed. The semiconductor chip 200b is installed on the package substrate 300.

Since the second surface 102 is ground after installing the thick preliminary semiconductor chip 200a on the package substrate 300, the package substrate 300 supports the preliminary semiconductor chip 200a while grinding the second surface 102. As a result, the thickness of the semiconductor chip may be reduced to form a highly integrated package.

Afterwards, a second preliminary semiconductor chip may be installed on the semiconductor chip 200b (as shown in FIG. 5). A second surface of the second preliminary semiconductor chip is ground to form the semiconductor device illustrated in FIG. 5.

Alternatively, the second surface 102 may be ground before separating the chip regions by sawing the scribe region. In this case, the semiconductor substrate is sawed along the scribe region to form the semiconductor chip 200b. Therefore, the semiconductor chip 200b is directly installed on the package substrate 300 and the installed semiconductor chip 200b is not ground.

To sum up, embodiments of the present invention provide a semiconductor device with a semiconductor chip including a pillar-shaped terminal formed to penetrate a first chip area in a terminal region and a pad terminal formed on a first surface of the first chip substrate. The pillar-shaped terminal and the pad-shaped terminal may be connected to other underlying structures (e.g., a package substrate and/or another semiconductor chip). Thus, the semiconductor chip has an optimized structure. Since the first chip substrate is formed of an insulating material, the formation of the pillar-shaped terminal is done easily to reduce the fabrication cost for semiconductor devices. Moreover, it is possible to enhance an operating speed of the semiconductor device and achieve a highly integrated semiconductor device.

Although the present invention has been described in connection with the embodiment of the present invention illustrated in the accompanying drawings, it is not limited thereto. It will be apparent to those skilled in the art that various substitutions, modifications, and changes may be made without departing from the scope and spirit of the invention.

What is claimed is:

1. A semiconductor device comprising a semiconductor chip, wherein the semiconductor chip comprises:
    a first chip substrate having a first surface and a second surface that are opposite to each other;
    a second chip substrate adjacent to the first chip substrate, the second chip substrate having a first surface, a second surface opposite the first surface, and a side that is in contact with a side of the first chip substrate;
    a pillar-shaped terminal penetrating through the second chip substrate from the first surface of the second chip substrate to the second surface of the second chip substrate; and
    a pad-shaped terminal disposed on the first surface of the second chip substrate,
    wherein the second surfaces of the first and second chip substrates are substantially coplanar and the pillar-shaped terminal has a contact surface that is substantially coplanar with the second surface of the second chip substrate, and
    wherein the first chip substrate includes a semiconductor material and the second chip substrate includes an insulating material.

2. The semiconductor device as set forth in claim 1, wherein the second chip substrate is disposed to fill a hole formed to penetrate the first chip substrate.

3. The semiconductor device as set forth in claim 1, wherein the second chip substrate is disposed to surround the first chip substrate.

4. The semiconductor device as set forth in claim 1, wherein the semiconductor chip further comprises:
    a first wiring disposed on the first surface of the first chip substrate and extending onto the first surface of the second chip substrate to be electrically connected to the pillar-shaped terminal;
    an insulation layer interposed between the first surface of the first chip substrate and the first wiring;
    an interlayer dielectric disposed to cover the first surfaces of the first and second chip substrates and the first wiring; and
    a second wiring disposed on a portion of the interlayer dielectric and extending onto the first surface of the second substrate to be electrically connected to the pad-shaped terminal,
    wherein the interlayer dielectric is interposed between the pad-shaped terminal and the first surface of the second chip substrate.

5. The semiconductor device as set forth in claim 1, wherein the semiconductor chip further comprises:
    an interlayer dielectric disposed to cover the first surfaces of the first and second substrates;
    a wiring disposed on a portion of the interlayer dielectric and extending onto the first surface of the second substrate to be connected to the pad-shaped terminal; and
    a conductive plug disposed to penetrate the interlayer dielectric,
    wherein the interlayer dielectric is interposed between the pad-shaped terminal and the first surface of the second chip substrate and the conductive plug is disposed to electrically connect the pillar-shaped terminal and the pad-shaped terminal to each other.

6. The semiconductor device as set forth in claim 1, further comprising:
    a package substrate with a connection terminal; and
    another semiconductor chip with an input/output terminal (I/O terminal),
    wherein the semiconductor chip is installed on the package substrate to electrically connect the pad-shaped terminal and the connection terminal to each other, and the other semiconductor chip is stacked on the semiconductor chip to electrically connect the pillar-shaped terminal and the I/O terminal to each other.

7. The semiconductor device as set forth in claim 6, further comprising:
    a first bump interposed between the connection terminal and the pad-shaped terminal;

a second bump interposed between the I/O terminal and a contact surface of the pillar-shaped terminal;

a first bonding layer interposed between the semiconductor chip and the package substrate; and a second bonding layer interposed between the semiconductor chip and the other semiconductor chip.

8. The semiconductor device as set forth in claim 7, wherein the semiconductor chip further comprises:

a passivation layer disposed to cover the first surfaces of the first and second chip substrates and the pad-shaped terminal, wherein the passivation layer has an aperture formed to expose the pad-shaped terminal and wherein the first bump fills the aperture to be electrically connected to the pad-shaped terminal.

9. The semiconductor device as set forth in claim 6, wherein the other semiconductor chip comprises:

a first terminal having the same shape as the pillar-shaped terminal; and a second terminal having the same shape as the pad-shaped terminal, the second terminal being electrically connected to the contact surface of the pillar-shaped terminal.

10. A semiconductor device comprising a semiconductor chip, wherein the semiconductor chip comprises:

a first chip substrate having a first surface and a second surface that are opposite to each other, the first chip substrate being formed of a semiconductor material;

a second chip substrate disposed adjacent to the first chip substrate and having first and second surfaces that are opposite to each other, the second chip substrate being formed of an insulating material;

first and second pillar-shaped terminals respectively penetrating through the second chip substrate from the first surface of the second chip substrate to the second surface of the second chip substrate, the first and second pillar-shaped terminals being spaced apart from each other; and first and second pad-shaped terminals disposed on the first surface of the second chip substrate and spaced apart from each other, wherein an integrated circuit (IC) is formed on the first surface of the first chip substrate, the second surfaces of the first and second chip substrates are substantially coplanar, and each of the first and second pillar-shaped terminals has a contact surface that is substantially coplanar with the second surface of the second chip substrate.

11. The semiconductor device as set forth in claim 10, wherein the second chip substrate is disposed to fill a hole formed to penetrate the first chip substrate.

12. The semiconductor device as set forth in claim 10, wherein the second chip substrate is disposed to surround the first chip substrate.

13. The semiconductor device as set forth in claim 10, wherein the semiconductor chip further comprises:

a first wiring disposed on the first surface of the first chip substrate and extending onto the first surface of the second chip substrate to be electrically connected to the first pillar-shaped terminal;

an insulation layer interposed between the first surface of the first chip substrate and the first wiring;

an interlayer dielectric disposed to cover the first surfaces of the first and second chip substrates and the first wiring; and a second wiring disposed on a first portion the interlayer dielectric and extending onto the first surface of the second substrate to be connected to the first pad-shaped terminal;

a third wiring disposed on a second portion of the interlayer dielectric and extending onto the first surface of the second substrate to be connected to the second pad-shaped terminal; and a conductive plug disposed to penetrate the interlayer dielectric, wherein the interlayer dielectric is interposed between the pad-shaped terminal and the first surface of the second chip substrate and the conductive plug is disposed to electrically connect the second pillar-shaped terminal and the second pad-shaped terminal to each other.

14. The semiconductor device as set forth in claim 10, further comprising:

a package substrate with first and second connection terminals; and another semiconductor chip with first and second input/output terminals (first and second I/O terminals), wherein the semiconductor chip is installed on the package substrate to electrically connect the first and second pad-shaped terminals to the first and second connection terminals, respectively, and wherein the other semiconductor chip is stacked on the semiconductor chip to electrically connect the contact surfaces of the first and second pillar-shaped terminals to the first and second I/O terminals, respectively.

15. The semiconductor device as set forth in claim 14, further comprising:

first bumps interposed between the first connection terminal and the first pad-shaped terminal and between the second connection terminal and the second pad-shaped terminal, respectively;

second bumps interposed between the first I/O terminal and the first pillar-shaped terminal and between the second I/O terminal and the second pillar-shaped terminal, respectively;

a first bonding layer interposed between the semiconductor chip and the package substrate; and a second bonding layer interposed between the semiconductor chip and the other semiconductor chip.

* * * * *